US011016496B2

(12) United States Patent
Chen et al.

(10) Patent No.: US 11,016,496 B2
(45) Date of Patent: May 25, 2021

(54) TRANSFERRING SYNTHETIC LIDAR SYSTEM DATA TO REAL WORLD DOMAIN FOR AUTONOMOUS VEHICLE TRAINING APPLICATIONS

(71) Applicant: Argo AI, LLC, Pittsburgh, PA (US)

(72) Inventors: Kevin Chen, Stanford, CA (US); James Hays, Decatur, GA (US); Ersin Yumer, San Mateo, CA (US)

(73) Assignee: Argo AI, LLC, Pittsburgh, PA (US)

( * ) Notice: Subject to any disclaimer, the term of this patent is extended or adjusted under 35 U.S.C. 154(b) by 187 days.

(21) Appl. No.: 16/380,180

(22) Filed: Apr. 10, 2019

(65) Prior Publication Data

US 2020/0326717 A1      Oct. 15, 2020

(51) Int. Cl.
   *G05D 1/02*      (2020.01)
   *G06F 30/20*     (2020.01)
   *G01S 17/90*     (2020.01)
   *G06K 9/00*      (2006.01)
   *G09B 9/05*      (2006.01)
   *G05D 1/00*      (2006.01)

(52) U.S. Cl.
   CPC ............ *G05D 1/0221* (2013.01); *G01S 17/90* (2020.01); *G05D 1/0088* (2013.01); *G06F 30/20* (2020.01); *G05D 2201/0213* (2013.01)

(58) Field of Classification Search
   USPC ........................................................ 701/23
   See application file for complete search history.

(56) References Cited

U.S. PATENT DOCUMENTS

| 10,169,678 | B1* | 1/2019 | Sachdeva | G05D 1/0221 |
| 10,345,437 | B1* | 7/2019 | Russell | G01S 17/89 |
| 2017/0177954 | A1 | 6/2017 | Micks et al. | |
| 2018/0060725 | A1* | 3/2018 | Groh | G06N 3/08 |
| 2018/0349746 | A1* | 12/2018 | Vallespi-Gonzalez | G01S 17/89 |
| 2018/0373980 | A1* | 12/2018 | Huval | G06K 9/00805 |
| 2019/0318206 | A1* | 10/2019 | Smith | G01S 17/58 |
| 2020/0074266 | A1* | 3/2020 | Peake | G06K 9/6256 |
| 2020/0090357 | A1* | 3/2020 | Page-Caccia | G06T 7/521 |
| 2020/0180647 | A1* | 6/2020 | Anthony | G08G 1/0145 |

FOREIGN PATENT DOCUMENTS

WO      2018176000 A1     9/2018

OTHER PUBLICATIONS

Ku, Jason et al., "Joint 3D Proposal Generation and Object Detection from View Aggregation", Computer Vision and Pattern Recognition (cs.CV), Jul. 12, 2018.

(Continued)

*Primary Examiner* — Tyler D Paige
(74) *Attorney, Agent, or Firm* — Fox Rothschild LLP (57) ABSTRACT

Methods and systems are disclosed for correlating synthetic LiDAR data to a real-world domain for use in training an autonomous vehicle in how to operate in an environment. To do this, the system will obtain a data set of synthetic LiDAR data, transfer the synthetic LiDAR data to a two-dimensional representation, use the two-dimensional representation to train a model of a real-world environment, and use the trained model of the real-world environment to train an autonomous vehicle.

20 Claims, 5 Drawing Sheets

(56) References Cited

OTHER PUBLICATIONS

Gschwandtner, Michael et al., "BlenSor: Blender Sensor Simulation Toolbox", Advances in Visual Computing: 7th Inernational Symposium, (ISVC 2011), vol. 6939/2011, pp. 199-208, Springer Verlag, 2011.
Carla.org website, printed Mar. 21, 2019, http://carla.org/.
Zhu, Jun-Yan et al., "Unpaired Image-to-Image Translation using Cycle-Consistent Adversarial Networks", IEEE International Conference on Computer Vision (ICCV), 2017.
Wang, Zining et al., "Fusing Bird's Eye View LIDAR Point Cloud and Front View Camera Image for Deep Object Detection", Computer Vision and Pattern Recognition (cs.CV), Feb. 14, 2018.

* cited by examiner

TRANSFERRING SYNTHETIC LIDAR SYSTEM DATA TO REAL WORLD DOMAIN FOR AUTONOMOUS VEHICLE TRAINING APPLICATIONS

BACKGROUND

Autonomous vehicles require a significant amount of data about the environments in which they travel in order to detect and discern objects within the environment, as well as to predict actions of other objects, such as pedestrians and other vehicles. One system that is used to collect such data is a light detecting and ranging (LiDAR) system. A LiDAR system illuminates an object with light and measures the light reflected from the object with various detectors. The LiDAR system analyzes characteristics of the reflected light and develops three-dimensional (3D) point clouds of data that represent 3D shapes of objects in and features of the environment.

3D data sets are also needed to train autonomous vehicles to develop a knowledge base of actions and reactions in the environment. However, LiDAR data can be time-consuming and expensive to collect in all areas, and the positions of objects within any environment can constantly change.

This document describes embodiments that are directed to solving the issues described above, and/or other issues.

SUMMARY

This document describes methods of correlating synthetic LiDAR data to a real-world domain for use in training an autonomous vehicle in how to operate in an environment. To do this, the system will obtain a data set of synthetic LiDAR data, transfer the synthetic LiDAR data to a two-dimensional representation, use the two-dimensional representation to train a model of a real-world environment, and use the trained model of the real-world environment to train an autonomous vehicle.

In some embodiments, obtaining the data set of synthetic LiDAR data may include using a simulation application to generate the data set of synthetic LiDAR data by operating a virtual vehicle in a simulated environment of the simulation application. Using the simulation application to generate the data set of synthetic LiDAR data may include, as the virtual vehicle is operated in the simulated environment: (i) accessing depth images generated by the simulation; (ii) extracting samples from image frames generated by the simulation; and (iii) correlating the extracted samples to the depth images to approximate each extracted sample to a pixel in one or more of the depth images.

In some embodiments, transferring the synthetic LiDAR data to the two-dimensional representation may include transferring the synthetic LiDAR data to a birds-eye view representation. In other embodiments, transferring the synthetic LiDAR data to the two-dimensional representation may include generating two-dimensional front-view images.

In some embodiments, the system may generate ground truth annotations in various frames of synthetic LiDAR data to identify one or more objects in the synthetic LiDAR data. This may be done to the three-dimensional point cloud or to the two-dimensional images generated by transferring the synthetic LiDAR data to a two-dimensional representation.

In some embodiments, the system may receive images captured from the real-world environment. If so, then transferring the synthetic LiDAR data to the two-dimensional representation may include: (i) generating two-dimensional front-view images from the LiDAR data; and (ii) mapping one or more of the objects in the synthetic LiDAR data to one or more objects in the captured images. The system also may generate ground truth annotations in various frames of the synthetic LiDAR data to identify one or more objects in the synthetic LiDAR data; if so, then at least some of the front-view images may include one or more of the ground truth annotations that identify one or more objects. In addition or alternatively, using the two-dimensional representation to train the model of the real-world environment may include using the images captured from the real-world environment, the two-dimensional front-view images from the LiDAR data, and a result of the mapping to train the model of the real-world environment.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" (or "comprises") means "including (or includes), but not limited to." When used in this document, the term "exemplary" is intended to mean "by way of example" and is not intended to indicate that a particular exemplary item is preferred or required. Additional terms that are relevant to this disclosure will be defined at the end of this description.

The present disclosure generally relates the generation and processing of synthetic LiDAR data such as may be used in connection with an autonomous vehicle or other robotic system. Synthetic LiDAR data is currently generated by and used in vehicle simulators that simulate operation of a vehicle in an actual environment. In this disclosure, synthetic LiDAR data is used to train an autonomous vehicle and develop a knowledge base for the vehicle that the vehicle can use to operate in the real world.

Figure 1:
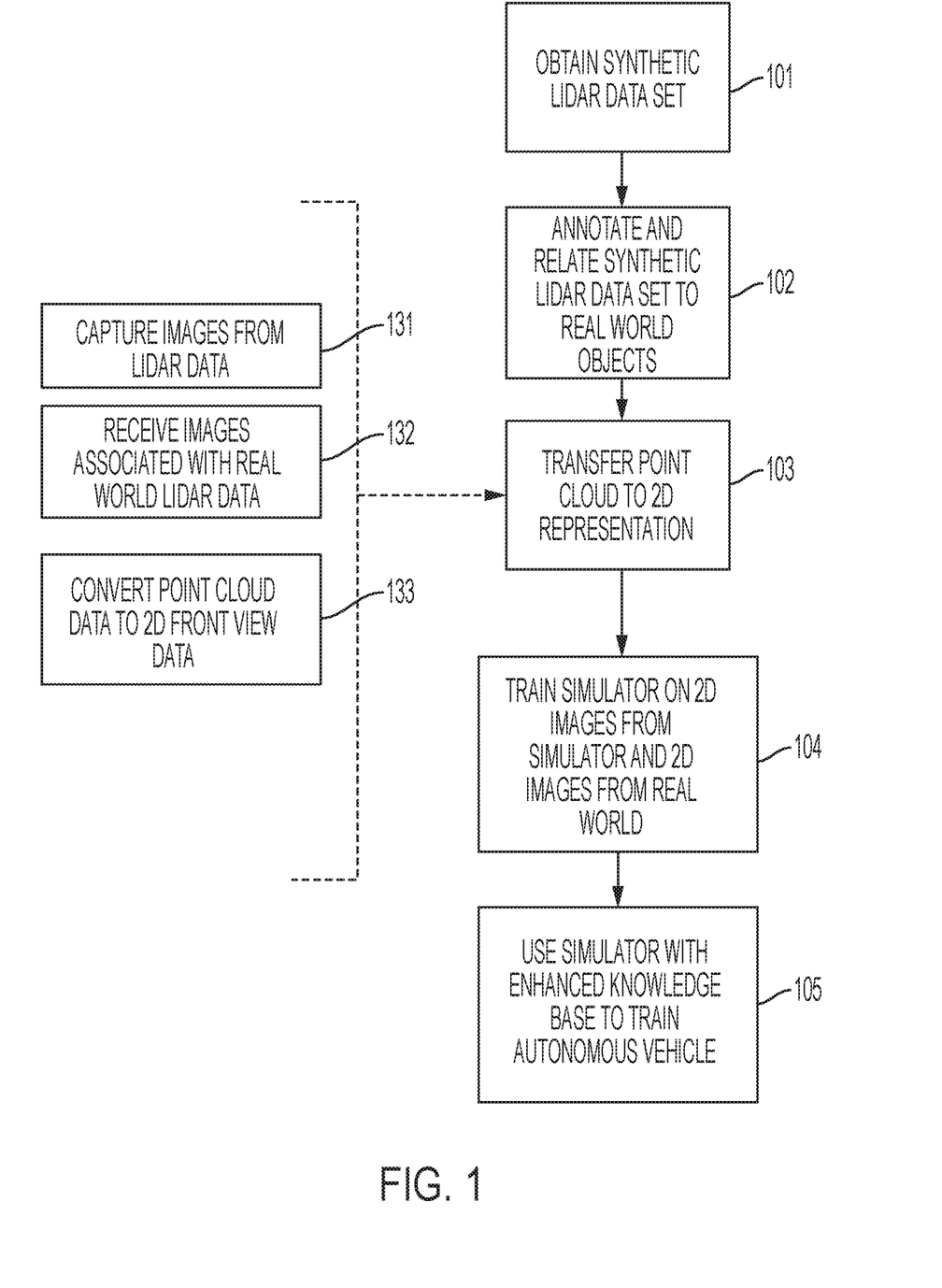
FIG. 1 is a flowchart illustrating a method of transferring synthetic LiDAR data to a real world domain.

Referring to the flowchart of FIG. 1, an electronic device that includes a processor may execute programming instructions to obtain a data set of synthetic LiDAR data (step 101). The synthetic LiDAR data will be a data set representing 3D shapes in a simulated environment.

Figure 2:
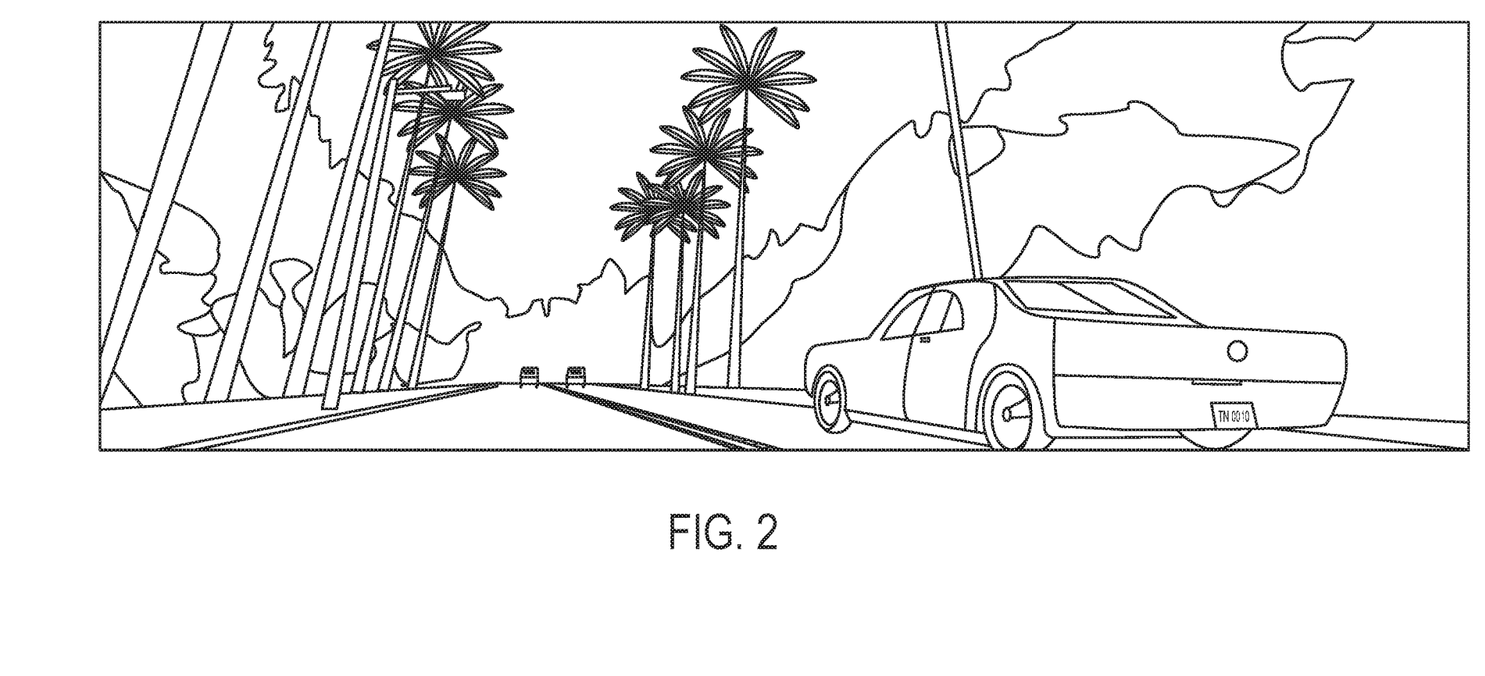
FIG. 2 is an example image from an autonomous vehicle operation simulation system as may exist in the prior art.

The system may draw upon an existing synthetic LiDAR data set, or it may generate one from an existing simulation application, such as driving simulators that are currently available for machine learning applications. One such simulator is that known as CARLA, a known open source simulation tool that is available for autonomous vehicle machine learning applications. An example display from such a prior art simulator is shown in FIG. 2, which illustrates a vehicle driving in a simulated environment. To obtain the simulated LiDAR data from the simulator, an operator of the simulator may drive a virtual vehicle in the simulator. The simulator will be programmed to collect synthetic LiDAR data from the simulated environment as the vehicle moves within the simulation. The electronic device may capture this synthetic LiDAR data and modify the simulated LiDAR data set to make it closer to an accurate representation of a real-world domain.

To capture the simulated LiDAR data, the processor may access the depth images of the simulation (e.g., two-dimensional images in which each pixel in the image has a value indicating the depth associated with the pixel) and extract samples from four depth maps (front, left, right, rear) of multiple frames. Given a specific elevation and azimuth to sample at, the system can approximate each extracted sample to a specific pixel in the depth image. Using the depth map in the simulation helps the simulator produce more accurate LiDAR returns. The system may capture data from any number of frames, with the system generating a more accurate representation the more frames that it captures.

Figure 3:
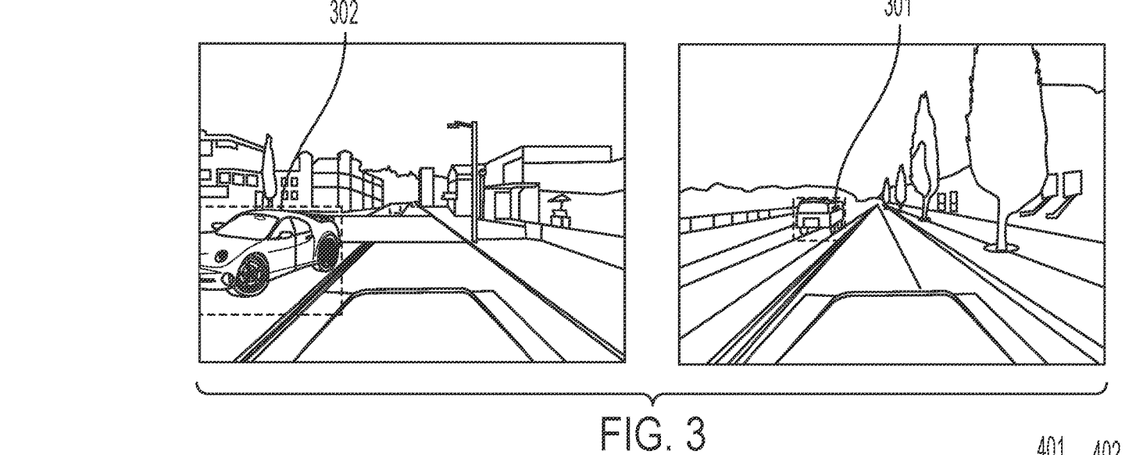
FIG. 3 illustrates how two-dimensional bounding boxes may be added to a frame of data in a simulation system to identify objects within the frame and establish ground truth.
Figure 4:
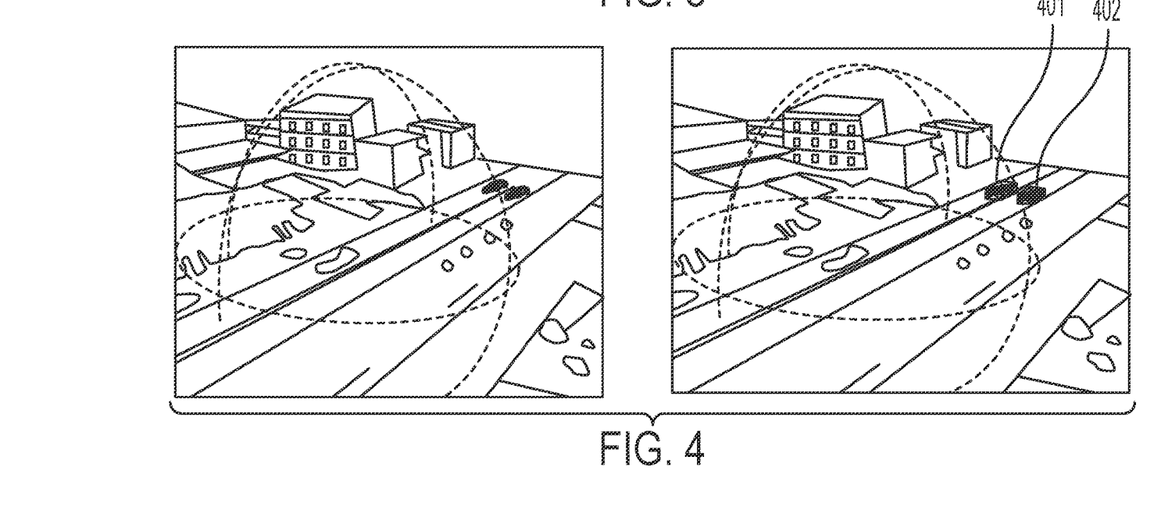
FIG. 4 illustrates how three-dimensional bounding boxes may be added to a frame of data in a simulation system.

Referring back to FIG. 1, the electronic device will also receive from the electronic simulator or another source identification of 2D bounding boxes and 3D bounding boxes that serve as ground truth annotations for various objects (such as pedestrians, other vehicles, and other obstacles) in each frame (step 102). The bounding boxes serve to annotate the data and relate the object(s) within the bounding boxes to real world objects. Examples of this are shown in FIG. 3, in which a first bounding box 301 is added around a vehicle in a first frame when the vehicle is located a first distance from the observation point (i.e., at a depth within the frame with respect to a location of the LiDAR sensor within the simulation). A second bounding box 302 is added around a vehicle in a second frame when the vehicle has moved closer to the observation point. In addition to the 2D bounding boxes shown in FIG. 3, the system may receive input and generate 3D bounding boxes as shown in FIG. 4, in which the system starts with a frame such as that on the left and adds cuboid annotations 401, 402 to identify vehicles as shown in the frame shown on the right of FIG. 4. During operation the simulation will attempt to predict the locations of these cuboids over time.

While synthetic LiDAR data can extremely useful, it typically differs from the data returned from a real LiDAR system in the real world. For example, real-world LiDAR system returns include some noise (e.g., errors) and interference patterns. Data captured from a real-world LiDAR system also has different characteristics based on the object that it is sensing (e.g., a black vehicle or a vehicle window will produce fewer returns than the body of a light-colored vehicle). This domain mismatch between synthetic LiDAR data and real-world LiDAR data can limit the usefulness of synthetic LiDAR data.

Thus, returning to FIG. 1, to transfer the synthetic LiDAR data to a real world domain (i.e., to make the synthetic data provide a more real representation of the real world), the system maps the synthetic LiDAR point cloud to a different LiDAR representation, such as a birds-eye view (BEV) representation (step 103). Because a BEV representation is a 2D representation, this process may not include depth data but will only encode the point with the highest height (i.e., the greatest depth value) in each cell.

When performing the transfer of the synthetic LiDAR data to a BEV representation, the system should mimic the sampling pattern of a particular LiDAR system that will be installed on the actual vehicle that will be trained, and the system should also mimic the sampling noise that is introduced by different objects and surfaces. The system may do this by using convolutional neural network (CNN) that implements a generative model, such as the generative adversarial network approach that is known as the Cycle-Generative Adversarial Network (CycleGAN) model. The CycleGAN model is able to perform transformations without one-to-one mapping between training data in source and target domains. In the system discussed in this application, the CycleGAN model may be provided with two image sets: one set of images associated with the synthetic LiDAR data set and another associated with real-world LiDAR data, and it may thus transform the images in the synthetic LiDAR data set to those of the real world.

Thus, to transfer the synthetic LiDAR point cloud representation to the BEV representation (step 103), the system may capture images from the simulator (i.e., the synthetic LiDAR data) (step 131) using methods such as using a simulated camera of the simulation environment to capture or generate simulated images from the synthetic LiDAR data. The system may also receive—such as from data set captured by one or more cameras mounted on a real-world vehicle that includes a real-world LIDAR system—images from a real-world environment (step (132).

The system converts the synthetic LiDAR point cloud to 2D front view images using equations such as:

$$c = \lfloor a \tan 2(y,x)/\Delta\theta \rfloor$$

$$r = \lfloor a \tan 2(z,\sqrt{x^2+y^2})/\Delta\phi \rfloor$$

in which c represents the column of the image and r represents the row of the image to which a particular LiDAR point (x, y, z) will be projected.

This process creates two-channel images, with one channel for depth and one channel for intensity. Optionally, the system may only consider a depth channel of a specified size (for example, with values ranging from [0, 120] meters). After generating a set of front images for the synthetic LiDAR data and a set of front view images for the real-world environment, the system may use these image sets to train the CNN (such as the CycleGAN model) (step 104). To do this, the system may extract and sample dense front view depth images from the synthetic LiDAR data. In a dense front view depth image, each (or substantially each) pixel of the image will be associated with a depth measurement, which is similar to what an ideal LiDAR system would produce if it could do so. While the dense images of the synthetic LiDAR data set may look less like real LiDAR samples, the dense image may have more information than the typical real-world LiDAR image for the system to consider. To reduce downsampling artifacts in the point cloud, the system may create a data set of synthetic, dense front view images. The system may add additional channels, such as semantic class, from the simulation to the dense front view images.

Thus, a practical application of the LiDAR data conversion method is to improve an autonomous vehicle simulation so that it will use synthetic LiDAR data that is closer to a real-world environment than it would be without the conversion. This helps to further reduce the amount of time that an autonomous vehicle will need to use in the actual real world to build a knowledge base of actions and reactions in an environment.

Figure 5:
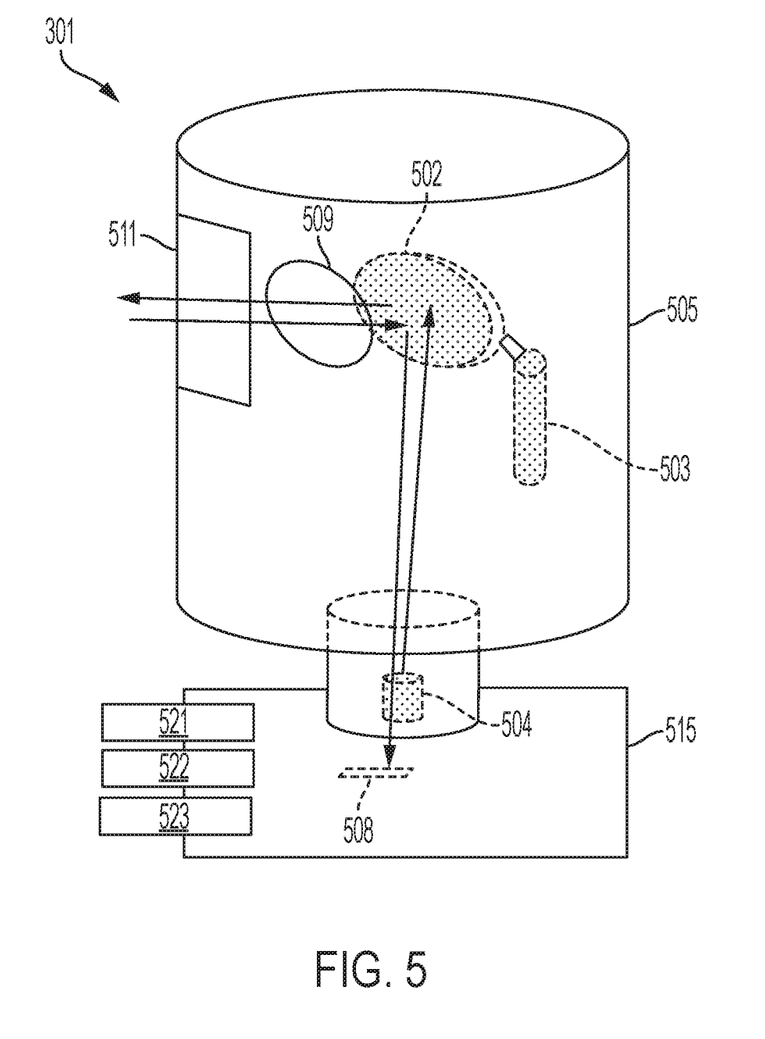
FIG. 5 illustrates example elements of a LiDAR system that may be used to collect real-world LiDAR data.

FIG. 5 shows an example LiDAR system 501 as may be used in various embodiments to collect LiDAR point clouds in a real-world environment. As shown in FIG. 5, the LiDAR system includes a scanner housing 505 with a light emitter/receiver shell portion 511 arranged around the perimeter of the housing. The shell portion 511 will be made of a material that is transparent to light, so that the system may emit light (such as infrared light) through the shell portion 511 and receive light that is reflected back toward the shell portion. While the example of FIG. 5 only shows a segment of the shell portion 511, in practice the shell portion will encircle the entire circumference of the housing 505.

The LiDAR system 501 will include a light emitter system 504 that is positioned and configured to generate and emit pulses of light out of the shell portion 511 via one or more laser emitter chips or other light emitting devices. The emitter system 504 may include any number of individual emitters, including for example 8 emitters, 64 emitters or 128 emitters.

The LiDAR system 501 will also include a light detector 508 containing a photodetector or array of photodetectors positioned and configured to receive light reflected back into the system. As shown below, both the emitter system 504 and the light detector unit 508 may be positioned at angles from the front side of a mirror 502. The mirror 502 is connected to a motor 503 that can rotate the mirror 360° so that the system may emit and receive light through the entire circumference of the shell portion 511. As shown, the light emitted by the emitter system 504 reflects off of the front of the mirror 502 before exiting the shell portion 511, and light received into the shell portion also reflects off of the front of the mirror 502 toward the light detector unit 508. However, in alternate embodiments, the mirror 502 may include a slot, the laser emitter system 504 may be located behind the mirror 502 at a position from which it will direct light through the slot, and the motor 503 may rotate the laser emitter system 504 and the mirror 502 as a single unit. Optionally, the light detector unit 508 also may be connected to a rotating structure of which the mirror 502 and laser emitter system 504 are a part so that it too rotates with the rotating light emitting/receiving structure.

One or more optical element structures 509 may be positioned in front of the mirror 502 to focus and direct light that is passed through the optical element structure 509. As shown below, the system includes an optical element structure 509 positioned in front of the mirror 502 and connected to the rotating elements of the system so that the optical element structure 509 rotates with the mirror 502. Alternatively or in addition, the optical element structure 509 may include multiple such structures (for example lenses and/or waveplates). Optionally, multiple optical element structures 509 may be arranged in an array on or integral with the shell portion 511.

Optionally, each optical element structure 509 may include a beam splitter that separates light that the system receives from light that the system generates. The beam splitter may include, for example, a quarter-wave or half-wave waveplate to perform the separation and ensure that received light is directed to the receiver unit rather than to the emitter system (which could occur without such a waveplate as the emitted light and received light should exhibit the same or similar polarizations).

The LiDAR system will include a power unit 521 to power the light emitter unit 504, a motor 503, and electronic components. The LiDAR system will also include an analyzer 515 with elements such as a processor 522 and non-transitory computer-readable memory 523 containing programming instructions that are configured to enable the system to receive data collected by the light detector unit, analyze it to measure characteristics of the light received, and generate information that a connected system can use to make decisions about operating in an environment from which the data was collected. Optionally, the analyzer 515 may be integral with the LiDAR system 501 as shown, or some or all of it may be external to the LiDAR system and communicatively connected to the LiDAR system via a wired or wireless communication network or link.

Figure 6:
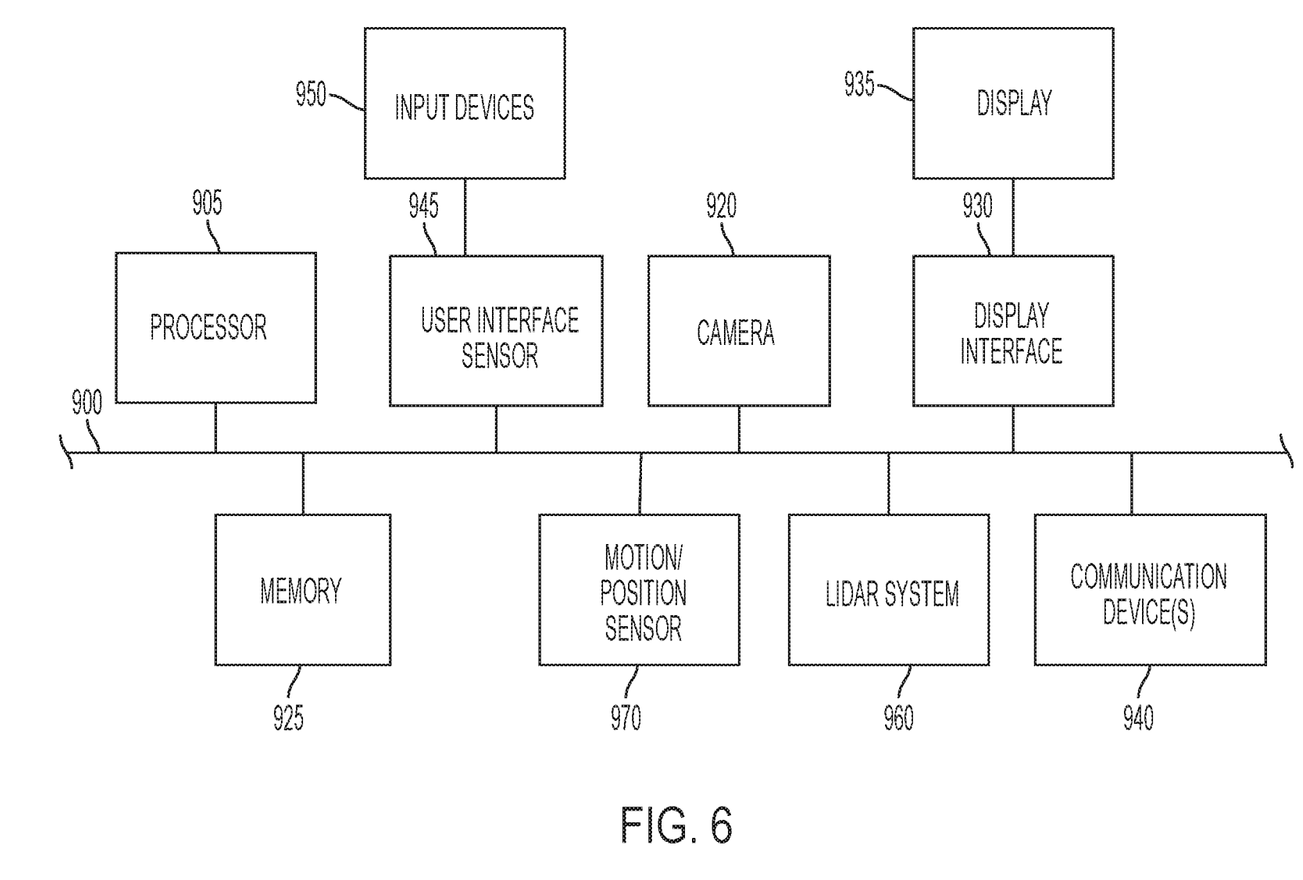
FIG. 6 illustrates example elements of a computing system that may be used to generate synthetic LiDAR data and process the simulated and real-world LiDAR data as discussed above.

FIG. 6 depicts an example of internal hardware that may be included in any of the electronic components of the system, such as internal processing systems, external monitoring and reporting systems, or remote servers. An electrical bus 900 serves as an information highway interconnecting the other illustrated components of the hardware. Processor 905 is a central processing device of the system, configured to perform calculations and logic operations required to execute programming instructions. As used in this document and in the claims, the terms "processor" and "processing device" may refer to a single processor or any number of processors in a set of processors that collectively perform a set of operations, such as a central processing unit (CPU), a graphics processing unit (GPU), a remote server, or a combination of these. Read only memory (ROM), random access memory (RAM), flash memory, hard drives and other devices capable of storing electronic data constitute examples of memory devices 925. A memory device may include a single device or a collection of devices across which data and/or instructions are stored. Various embodiments of the invention may include a computer-readable medium containing programming instructions that are configured to cause one or more processors to perform the functions described in the context of the previous figures.

An optional display interface 930 may permit information from the bus 900 to be displayed on a display device 935 in visual, graphic or alphanumeric format. An audio interface and audio output (such as a speaker) also may be provided. Communication with external devices may occur using various communication devices 940 such as a wireless antenna, an RFID tag and/or short-range or near-field communication transceiver, each of which may optionally communicatively connect with other components of the device via one or more communication system. The communication device(s) 940 may be configured to be communicatively connected to a communications network, such as the Internet, a local area network or a cellular telephone data network.

The hardware may also include a user interface sensor 945 that allows for receipt of data from input devices 950 such as a keyboard, a mouse, a joystick, a touchscreen, a touch pad, a remote control, a pointing device and/or microphone. Digital image frames also may be received from a camera 920 that can capture video and/or still images. The system also may receive data from a motion and/or position sensor 970 such as an accelerometer, gyroscope or inertial measurement unit. The system also may receive data from a LiDAR system 960 such as that described earlier in this document.

The above-disclosed features and functions, as well as alternatives, may be combined into many other different systems or applications. Various components may be implemented in hardware or software or embedded software. Various presently unforeseen or unanticipated alternatives, modifications, variations or improvements may be made by those skilled in the art, each of which is also intended to be encompassed by the disclosed embodiments.

Terminology that is relevant to the disclosure provided above includes;

An "automated device" or "robotic device" refers to an electronic device that includes a processor, programming instructions, and one or more components that based on commands from the processor can perform at least some operations or tasks with minimal or no human intervention. For example, an automated device may perform one or more automatic functions or function sets. Examples of such operations, functions or tasks may include without, limitation, navigation, transportation, driving, delivering, loading, unloading, medical-related processes, construction-related processes, and/or the like. Example automated devices may include, without limitation, autonomous vehicles, drones and other autonomous robotic devices.

An "electronic device" or a "computing device" refers to a device that includes a processor and memory. Each device may have its own processor and/or memory, or the processor and/or memory may be shared with other devices as in a virtual machine or container arrangement. The memory will contain or receive programming instructions that, when executed by the processor, cause the electronic device to perform one or more operations according to the programming instructions.

The terms "memory," "memory device," "data store," "data storage facility" and the like each refer to a non-transitory device on which computer-readable data, programming instructions or both are stored. Except where specifically stated otherwise, the terms "memory," "memory device," "data store," "data storage facility" and the like are intended to include single device embodiments, embodiments in which multiple memory devices together or collectively store a set of data or instructions, as well as individual sectors within such devices.

The terms "processor" and "processing device" refer to a hardware component of an electronic device that is configured to execute programming instructions. Except where specifically stated otherwise, the singular term "processor" or "processing device" is intended to include both single-processing device embodiments and embodiments in which multiple processing devices together or collectively perform a process.

The term "vehicle" refers to any moving form of conveyance that is capable of carrying either one or more human occupants and/or cargo and is powered by any form of energy. The term "vehicle" includes, but is not limited to, cars, trucks, vans, trains, autonomous vehicles, aircraft, aerial drones and the like. An "autonomous vehicle" is a vehicle having a processor, programming instructions and drivetrain components that are controllable by the processor without requiring a human operator. An autonomous vehicle may be fully autonomous in that it does not require a human operator for most or all driving conditions and functions, or it may be semi-autonomous in that a human operator may be required in certain conditions or for certain operations, or that a human operator may override the vehicle's autonomous system and may take control of the vehicle.

The term "execution flow" refers to a sequence of functions that are to be performed in a particular order. A function refers to one or more operational instructions that cause a system to perform one or more actions. In various embodiments, an execution flow may pertain to the operation of an automated device. For example, with respect to an autonomous vehicle, a particular execution flow may be executed by the vehicle in a certain situation such as, for example, when the vehicle is stopped at a red stop light that has just turned green. For instance, this execution flow may include the functions of determining that the light is green, determining whether there are any obstacles in front of or in proximity to the vehicle and, only if the light is green and no obstacles exist, accelerating. When a subsystem of an automated device fails to perform a function in an execution flow, or when it performs a function out of order in sequence, the error may indicate that a fault has occurred or that another issue exists with respect to the execution flow.

An "automated device monitoring system" is a set of hardware that is communicatively and/or electrically connected to various components (such as sensors) of an automated device to collect status or operational parameter values from those components. An automated device monitoring system may include or be connected to a data logging device that includes a data input (such as a wireless receiver) that is configured to receive device operation data directly or indirectly from the device's components. The monitoring system also may include a processor, a transmitter and a memory with programming instructions. A monitoring system may include a transmitter for transmitting commands and/or data to external electronic devices and/or remote servers. In various embodiments, a monitoring system may be embedded or integral with the automated device's other computing system components, or it may be a separate device that is in communication with one or more other local systems, such as, for example in the context of an autonomous vehicle, and on-board diagnostics system.

As used in this document, the term "light" means electromagnetic radiation associated with optical frequencies, e.g., ultraviolet, visible, infrared and terahertz radiation. Example emitters of light include laser emitters and other emitters that emit converged light. In this document, the term "emitter" will be used to refer to an emitter of light, such as a laser emitter that emits infrared light.

In this document, when terms such "first" and "second" are used to modify a noun, such use is simply intended to distinguish one item from another, and is not intended to require a sequential order unless specifically stated. In addition, terms of relative position such as "vertical" and "horizontal", or "front" and "rear", when used, are intended to be relative to each other and need not be absolute, and only refer to one possible position of the device associated with those terms depending on the device's orientation.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. A method of correlating synthetic LiDAR data to a real-world domain for training an autonomous vehicle, the method comprising, by a processing device:
   obtaining a data set of synthetic LiDAR data;
   transferring the synthetic LiDAR data to a two-dimensional representation;
   using the two-dimensional representation to train a model of a real-world environment; and
   using the trained model of the real-world environment to train an autonomous vehicle.

2. The method of claim 1, wherein obtaining the data set of synthetic LiDAR data comprises using a simulation application to generate the data set of synthetic LiDAR data by operating a virtual vehicle in a simulated environment of the simulation application.

3. The method of claim 2, wherein using the simulation application to generate the data set of synthetic LiDAR data comprises, as the virtual vehicle is operated in the simulated environment:
   accessing a plurality of depth images generated by the simulation;
   extracting samples from a plurality of image frames generated by the simulation; and
   correlating the extracted samples to the depth images to approximate each extracted sample to a pixel in one or more of the depth images.

4. The method of claim 1, wherein transferring the synthetic LiDAR data to the two-dimensional representation comprises transferring the synthetic LiDAR data to a birds-eye view representation.

5. The method of claim 1, wherein transferring the synthetic LiDAR data to the two-dimensional representation comprises generating a plurality of two-dimensional front-view images.

6. The method of claim 1, further comprising generating ground truth annotations in a plurality of frames of synthetic LiDAR data to identify one or more objects in the synthetic LiDAR data.

7. The method of claim 1, wherein:
   the method further comprises receiving a plurality of images captured from the real-world environment; and
   transferring the synthetic LiDAR data to the two-dimensional representation comprises:
      generating a plurality of two-dimensional front-view images from the LiDAR data, and
      mapping one or more of the objects in the synthetic LiDAR data to one or more objects in the plurality of images.

8. The method of claim 7, wherein:
   the method further comprises generating ground truth annotations in a plurality of frames of the data set of synthetic LiDAR data to identify one or more objects in the synthetic LiDAR data; and
   wherein at least some of the front-view images comprise one or more of the ground truth annotations that identify one or more objects.

9. The method of claim 7, wherein using the two-dimensional representation to train the model of the real-world environment comprises using the plurality of images captured from the real-world environment, the two-dimensional front-view images from the LiDAR data, and a result of the mapping to train the model of the real-world environment.

10. A system for correlating synthetic LiDAR data to a real-world domain for training an autonomous vehicle, the system comprising:
   a processor;
   a non-transitory memory that stores a data set of synthetic LiDAR data; and
   a non-transitory memory containing programming instructions that are configured to cause the processor to:
      access the data set of synthetic LiDAR data and extract synthetic LiDAR data from the data set,
      transfer the extracted synthetic LiDAR data to a two-dimensional representation,
      use the two-dimensional representation to train a model of a real-world environment, and
      use the trained model of the real-world environment to train an autonomous vehicle.

11. The system of claim 10, further comprising additional programming instructions that are configured to cause a processor to implement a simulation application that generates the data set of synthetic LiDAR data by operating a virtual vehicle in a simulated environment of the simulation application.

12. The system of claim 11, wherein the programming instructions to implement the simulation application that generates the data set of synthetic LiDAR data comprise instructions to, as the virtual vehicle is operated in the simulated environment:
   access a plurality of depth images generated by the simulation;
   extract samples from a plurality of image frames generated by the simulation; and
   correlate the extracted samples to the depth images to approximate each extracted sample to a pixel in one or more of the depth images.

13. The system of claim 10, wherein the programming instructions to transfer the synthetic LiDAR data to the two-dimensional representation comprises instructions to transfer the synthetic LiDAR data to a birds-eye view representation.

14. The system of claim 10, wherein the programming instructions to transfer the synthetic LiDAR data to the two-dimensional representation comprise instructions to generate a plurality of two-dimensional front-view images.

15. The system of claim 10, further comprising additional programming instructions that are configured to cause the processor to generate ground truth annotations in a plurality of frames of synthetic LiDAR data to identify one or more objects in the synthetic LiDAR data.

16. The system of claim 10:
   further comprising additional programming instructions that are configured to cause the system to receive a plurality of images captured from the real-world environment; and
   wherein the instructions to transfer the synthetic LiDAR data to the two-dimensional representation comprise instructions to:
      generate a plurality of two-dimensional front-view images from the LiDAR data, and
      map one or more of the objects in the synthetic LiDAR data to one or more objects in the plurality of images.

17. The system of claim 16:
   further comprising additional programming instructions that are configured to cause the processor to generate ground truth annotations in a plurality of frames of the data set of synthetic LiDAR data to identify one or more objects in the synthetic LiDAR data; and
   wherein at least some of the front-view images comprise one or more of the ground truth annotations that identify one or more objects.

18. The system of claim 16, wherein the instructions to use the two-dimensional representation to train the model of the real-world environment comprise instructions to use the plurality of images captured from the real-world environment, the two-dimensional front-view images from the LiDAR data, and a result of the mapping to train the model of the real-world environment.

19. A non-transitory computer-readable medium containing programming instructions for correlating synthetic LiDAR data to a real-world domain and training an autonomous vehicle, the instructions comprising instructions to:
   receive a plurality of images captured from a real-world environment;
   implement a simulation application that generates a data set of synthetic LiDAR data by operating a virtual vehicle in a simulated environment of the simulation application;

extract synthetic LiDAR data from the data set;
transfer the extracted synthetic LiDAR data to a two-dimensional representation by:
  generating a plurality of two-dimensional front-view images from the LiDAR data, and
  mapping one or more of the objects in the synthetic LiDAR data to one or more objects in the plurality of images;
use the two-dimensional representation to train a model of the real-world environment; and
use the trained model of the real-world environment to train an autonomous vehicle.

20. The computer-readable medium of claim 19, wherein:
the programming instructions to implement the simulation application that generates the data set of synthetic LiDAR data comprise instructions to, as the virtual vehicle is operated in the simulated environment:
  access a plurality of depth images generated by the simulation,
  extract samples from a plurality of image frames generated by the simulation, and
  correlate the extracted samples to the depth images to approximate each extracted sample to a pixel in one or more of the depth images.

* * * * *